(12) United States Patent
Felici

(10) Patent No.: US 11,112,431 B2
(45) Date of Patent: *Sep. 7, 2021

(54) PROBE CARD FOR HIGH-FREQUENCY APPLICATIONS

(71) Applicant: TECHNOPROBE S.P.A., Cernusco Lombardone (IT)

(72) Inventor: Stefano Felici, San Jose, CA (US)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 55 days.

This patent is subject to a terminal disclaimer.

(21) Appl. No.: 16/537,727

(22) Filed: Aug. 12, 2019

(65) Prior Publication Data

US 2019/0361050 A1    Nov. 28, 2019

Related U.S. Application Data

(63) Continuation-in-part of application No. PCT/EP2018/053615, filed on Feb. 14, 2018.

(30) Foreign Application Priority Data

Feb. 15, 2017  (IT) .......................... 102017000017037

(51) Int. Cl.
*G01R 1/073* (2006.01)
*G01R 3/00* (2006.01)

(52) U.S. Cl.
CPC ........... *G01R 1/07314* (2013.01); *G01R 3/00* (2013.01)

(58) Field of Classification Search
CPC ............................. G01R 1/07314; G01R 3/00
See application file for complete search history.

(56) References Cited

U.S. PATENT DOCUMENTS

| 2004/0036493 A1 | 2/2004 | Miller |
| 2004/0046579 A1 | 3/2004 | Chraft et al. |
| 2004/0070413 A1 | 4/2004 | Kasukabe et al. |

(Continued)

FOREIGN PATENT DOCUMENTS

| TW | 589453 | 6/2004 |
| TW | 200425374 | 11/2004 |

(Continued)

*Primary Examiner* — Paresh Patel
(74) *Attorney, Agent, or Firm* — Allen, Dyer, Doppelt + Gilchrist, P.A.

(57) ABSTRACT

A probe card of a testing apparatus of electronic devices comprises a testing head, which houses a plurality of contact elements extending along a longitudinal axis between a first end portion and a second end portion, a support plate, onto which the first end portion is adapted to abut, and a flexible membrane. Suitably, the testing head is arranged between the support plate and a first portion of the flexible membrane, which is connected to the support plate through a second portion thereof, the probe card further comprising a plurality of contact tips arranged on a first face of the flexible membrane at the first portion thereof, the second end portion of each contact element being apt to abut onto a second face of the flexible membrane, opposite to the first face, the number and distribution of the contact elements being different to the number and distribution of the contact tips.

23 Claims, 9 Drawing Sheets

(56) References Cited

U.S. PATENT DOCUMENTS

| | | | |
|---|---|---|---|
| 2006/0066332 A1* | 3/2006 | Miller | G01R 31/2889 |
| | | | 324/754.14 |
| 2006/0125501 A1* | 6/2006 | Liu | H05K 3/4007 |
| | | | 324/750.25 |
| 2008/0061808 A1 | 3/2008 | Mok et al. | |
| 2009/0042323 A1 | 2/2009 | Kasukabe et al. | |
| 2009/0212798 A1 | 8/2009 | Kasukabe et al. | |
| 2015/0192609 A1 | 7/2015 | Hsu | |

FOREIGN PATENT DOCUMENTS

| | | |
|---|---|---|
| TW | 200606436 | 2/2006 |
| TW | 200908450 | 2/2009 |
| TW | 201003075 | 1/2010 |
| TW | 201140095 | 11/2011 |
| TW | 201202710 | 1/2012 |
| TW | 201316014 | 4/2013 |
| TW | 201512678 | 4/2015 |
| TW | 201625962 | 7/2016 |

* cited by examiner

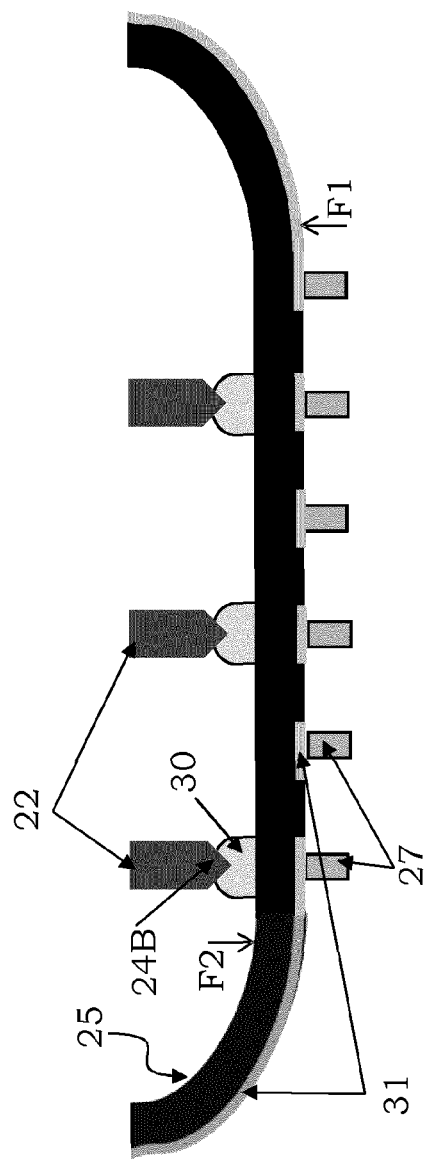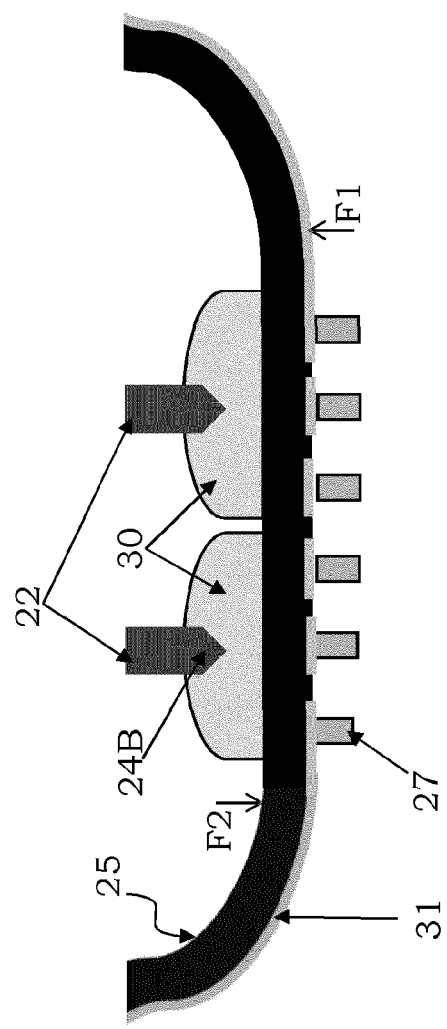

PROBE CARD FOR HIGH-FREQUENCY APPLICATIONS

BACKGROUND

Technical Field

The disclosure refers to a probe card for testing electronic devices that are integrated on a semiconductor wafer, more particularly, comprising a testing head, which houses a plurality of contact elements extending along a longitudinal axis between a first end portion and a second end portion, and a support plate which said first end portion is adapted to abut onto.

The following disclosure is made referring to this field of application with the sole aim of simplifying the presentation thereof.

Description of the Related Art

As it is well known, a testing card, also known as probe card, is essentially a device adapted to electrically connect a plurality of contact pads of a microstructure, in particular an electronic device that is integrated on a semiconductor wafer, with corresponding channels of a testing apparatus that performs the functionality testing, in particular electric, thereof, or the test, generically.

The test, which is performed on integrated devices, is particularly useful in detecting and isolating defective circuits as early as in the production phase. Normally probe cards are therefore employed for the electric test of devices that are integrated on wafers before cutting and assembling them inside a chip containment package.

A probe card comprises a testing head, which essentially includes in turn a plurality of movable contact probes retained by at least one pair of supports or guides that are substantially plate-shaped and parallel to each other. Said plate-shaped supports are provided with suitable holes and are arranged at a certain distance from each other in order to leave a free space or air gap for the movement and possible deformation of the contact probes, which are usually made of wires of special alloys with good electric and mechanical properties.

In particular, FIG. 1 schematically illustrates a probe card 15 including a testing head 1 comprising in turn at least one plate-shaped support or upper guide 2, usually indicated as "upper die", and a plate-shaped support or lower guide 3, usually indicated as "lower die", having respective guide holes 4 and 5 which a plurality of contact probes 6 slides within.

Each contact probe 6 ends at an end with a contact tip 7 intended to abut onto a contact pad 8 of a device under test that is integrated on a wafer 9, so as to realize the mechanical and electric contact between said device under test and a testing apparatus (not shown), which said probe card forms an end element of.

As indicated in FIG. 1, the upper die 2 and the lower die 3 are suitably spaced by an air gap 10 that allows the deformation of the contact probes 6.

Good connection between the contact probes 6 and the contact pads 8 of the device under test is ensured by the pressure of the testing head 1 on the device itself, the contact probes 6, mobile within the guide holes realized on the guides, undergoing, during said pressing contact, a bending inside the air gap 10 and a sliding inside said guide holes.

Testing heads of this type are commonly called testing heads with vertical probes and indicated with the English term: "vertical probe head".

In some cases, the contact probes are fixedly fastened to the head itself at the upper plate-shaped support: such testing heads are referred to as blocked testing heads.

More frequently, however, testing heads are used with not fixedly fastened blocked probes, but held interfaced to a so-called board, possibly through a micro-contact board: such testing heads are referred to as unblocked testing heads. The micro-contact board is usually called "space transformer" since, besides contacting the probes, it also allows spatially redistributing the contact pads realized thereon with respect to the contact pads on the device under test, in particular relaxing the distance constraints between the centers of the pads themselves.

In this case, still with reference to FIG. 1, each contact probe 6 has a further end area or region ending with a so-called contact head 11 towards a contact pad 12 of a plurality of contact pads of a space transformer 13 of the probe card 15 comprising the testing head 1. Good electric connection between contact probes 6 and space transformer 13 is ensured by pressing-abutting the contact heads 11 of the contact probes 6 onto the contact pads 12 of said space transformer 13 analogously to the contact between the contact tips 7 with the contact pads 8 of the device under test that is integrated on the wafer 9.

Furthermore, the probe card 15 comprises a support plate 14, generally a printed circuit board (PCB), connected to the space transformer 13, by means of which the probe card 15 interfaces with the testing apparatus.

The correct working of a probe card is basically linked to two parameters: the vertical movement, or overtravel, of the contact probes and the horizontal movement, or scrub, of the contact tips of said contact probes. As known, it is important to ensure the scrub of the contact tips, so as to allow scrubbing the surface of the contact pads, removing in this way the impurities that are for example in the form of a thin layer or oxide film and improving the contact performed by the probe card.

All these features should be evaluated and calibrated in the manufacturing step of a probe card, since the good electric connection between probes and device under test should always be ensured.

It is also important to ensure that the pressing contact of the contact tips of the probes onto the contact pads of the device be not so high as to cause the breakage of the probe or the pad itself.

This problem is strongly felt in the case of the so-called short probes, namely probes with limited body height, in particular with dimensions less than 5000 μm. Probes of this type are for instance used for high-frequency applications, the reduced length of the probes limiting the connected self-inductance phenomenon. In particular, the term "probes for high-frequency applications" indicates probes that are capable of carrying signals with frequencies higher than 1 GHz.

Indeed, the recent need is well known of producing probe cards capable of carrying signals at ever higher frequencies up to the radiofrequencies, with a consequent drastic reduction in length of the contact probes, so as to enable these signals to be carried without adding noise, for example due to the above-mentioned self-inductance phenomenon.

However, in this case, the reduced length of the body of the probes dramatically increases the rigidity of the probe itself, which implies an increase in the force applied by the respective contact tip onto the contact pads of a device under test, which can lead to the breakage of said pads, with irreparable damage to the device under test, obviously a situation that has to be avoided. Even more dangerously, the increase in the rigidity of the contact probe due to the reduction in the length of its body also increases the risk of breakage of the probes themselves.

US Patent Publications No. US 2004/0046579 A1 dated Mar. 11, 2004, and No. US 2004/0036493 A1 dated Feb. 26, 2004, in the name of FormFactor Inc. relate to a probe board assembly for providing signal paths between an integrated circuit (IC) tester and input/output (I/O), power and ground pads of one or more ICs to be tested; more particularly, the probe board assembly comprises an interposer, preferably including a rigid insulating substrate and a set of flexible spring contacts mounted on its upper surface and a corresponding set of flexible spring contacts mounted on its lower surface.

According to some embodiments, the undersides of flex cables have fingers extending under the space transformer over the IC pads that are to be accessed by conductors within the fingers, tips on the underside of fingers providing signal paths between the pads and the conductors within the fingers. The probe board assembly may also include probes connected between fingers and pads on the under surface of the space transformer that do not carry signals, but instead act only as flexible structural members, each probe supporting a finger and restricting its range of horizontal motion.

Moreover, US Patent Publication No. US 2008/0061808 A1 dated Mar. 13, 2008 in the name of INNOCONNEX, Inc. discloses probe card architectures providing partition of the spring compliance required for IC testing between several different components; more particularly, the probe card may include an interconnector substrate, a first spring network, which provides an interface for making electrical contacts to pads of a device being tested electrically and is connected at a first surface of the interconnector substrate and a second spring network which is on a second surface of the interconnector substrate and provides an interface to a tester.

The first and second spring networks thus allows the interconnect substrate to float (instead of being rigidly held) while the probe card is contacting a device being tested.

SUMMARY

The probe card is capable of carrying high-frequency signals without adding noise to said signals, meanwhile ensuring a correct working thereof when the relative contact probes contact the pads of a device under test, thus eliminating the risk of breakage of said contact probes and of the pads themselves.

According to an aspect of the disclosure the probe card has contact probes which are shaped as very short contact tips connected to a face of a flexible membrane, a contact element of a testing head included in the probe card being arranged at a contact tip, on the opposite face of the flexible membrane, said contact elements abutting onto said opposite face of said flexible membrane so as to damp the contact of the contact tips with corresponding pads of a device under test.

More particularly, the probe card of a testing apparatus of electronic devices comprises a testing head, which houses a plurality of contact elements extending along a longitudinal axis between a first end portion and a second end portion, a support plate, whereonto the first end portion is adapted to abut, and a flexible membrane, said probe card being characterized in that the testing head is arranged between the support plate and a first portion of the flexible membrane, which is in connection with the support plate by means of a second portion thereof, the probe card further comprising a plurality of contact tips arranged on a first face of the flexible membrane at a first portion thereof, the second end portion of each contact element being adapted to abut onto a second face, opposite the first face, of the flexible membrane, the number and distribution of the contact elements being different to the number and distribution of the contact tips.

More particularly, the probe card comprises the following additional and optional features, taken singularly or in combination if necessary.

According to an aspect of the disclosure, the contact tips can have a height less than 200 µm, said height being measured in a direction parallel to the longitudinal axis.

According to another aspect of the disclosure, the contact tips can be T-shaped and can be made of a conductive material selected from platinum, rhodium, palladium, silver, copper or an alloy thereof, preferably a platinum alloy.

Furthermore, the flexible membrane can include conductive tracks extending from the first portion at each contact tip towards the second portion of said flexible membrane.

Additionally, the contact tips can be welded to the conductive tracks or glued thereto by means of a conductive glue film.

According to an aspect of the disclosure, the conductive tracks can be electrically connected to contact pads of the support plate.

In particular, the flexible membrane and the support plate can be electrically connected by means of a pressing contact, a conductive rubber or by means of welding.

Alternatively, the conductive tracks can be directly connected to the testing apparatus by means of radiofrequency connection means.

It should also be pointed out that the conductive tracks can extend along the first and/or second face of the flexible membrane and/or can extend within the flexible membrane.

Furthermore, the flexible membrane can be made of polyamide.

According to an aspect of the disclosure, the contact elements of the testing head can comprise a group of contact elements, each contact element of said group being electrically connected to a corresponding contact tip, the contact elements not included in said group being electrically insulated from said contact tips and from the contact elements of said group. In this case, each contact element of said group can be electrically connected to a corresponding contact tip by means of connection conductive tracks made in said flexible membrane, said connection conductive tracks extending between the first face and the second face of said flexible membrane. Furthermore, the contact elements of said group can be adapted to carry power signals and/or ground signals and/or low-frequency signals.

According to an aspect of the disclosure, the flexible membrane can comprise a plurality of contact pads made on the second face thereof, whereonto the second end portion of the contact elements of the testing head is adapted to abut.

According to another aspect of the disclosure, at least one group of the contact pads of the flexible membrane can be made of a conductive material, the second end portions of the contact elements of the group of contact elements electrically connected to a corresponding contact tip abutting onto said contact pads of said group.

It should also be noted that the support plate can be a printed circuit board adapted to be connected to the testing apparatus.

According to another aspect of the disclosure, the probe card can further comprise a space transformer connected to the support plate.

According to yet another aspect of the disclosure, the testing head can comprise at least one upper guide and at least one lower guide, having respective guide holes, within which the contact elements are slidingly housed, the upper guide and the lower guide being separated from each other by an air gap.

The number of the contact elements may be smaller than the number of the contact tips.

Furthermore, the contact pads onto which the contact elements abut can extend so as to cover an area of the flexible membrane corresponding to more than one contact tip, more than one contact tip corresponding to each of said contact elements abutting onto said contact pads.

Finally, it should be noted that the first portion of the flexible membrane can be a central portion thereof, whereas the second portion of the flexible membrane can be a peripheral portion thereof.

The characteristics and advantages of the probe card according to the disclosure will be apparent from the description, made hereafter, of an embodiment thereof, given by indicative and non-limiting example, with reference to the accompanying drawings.

BRIEF DESCRIPTION OF THE DRAWINGS

FIGS. 6A and 6B show a detail of a probe card according to alternative embodiments of the disclosure;

DETAILED DESCRIPTION

Figure 1:
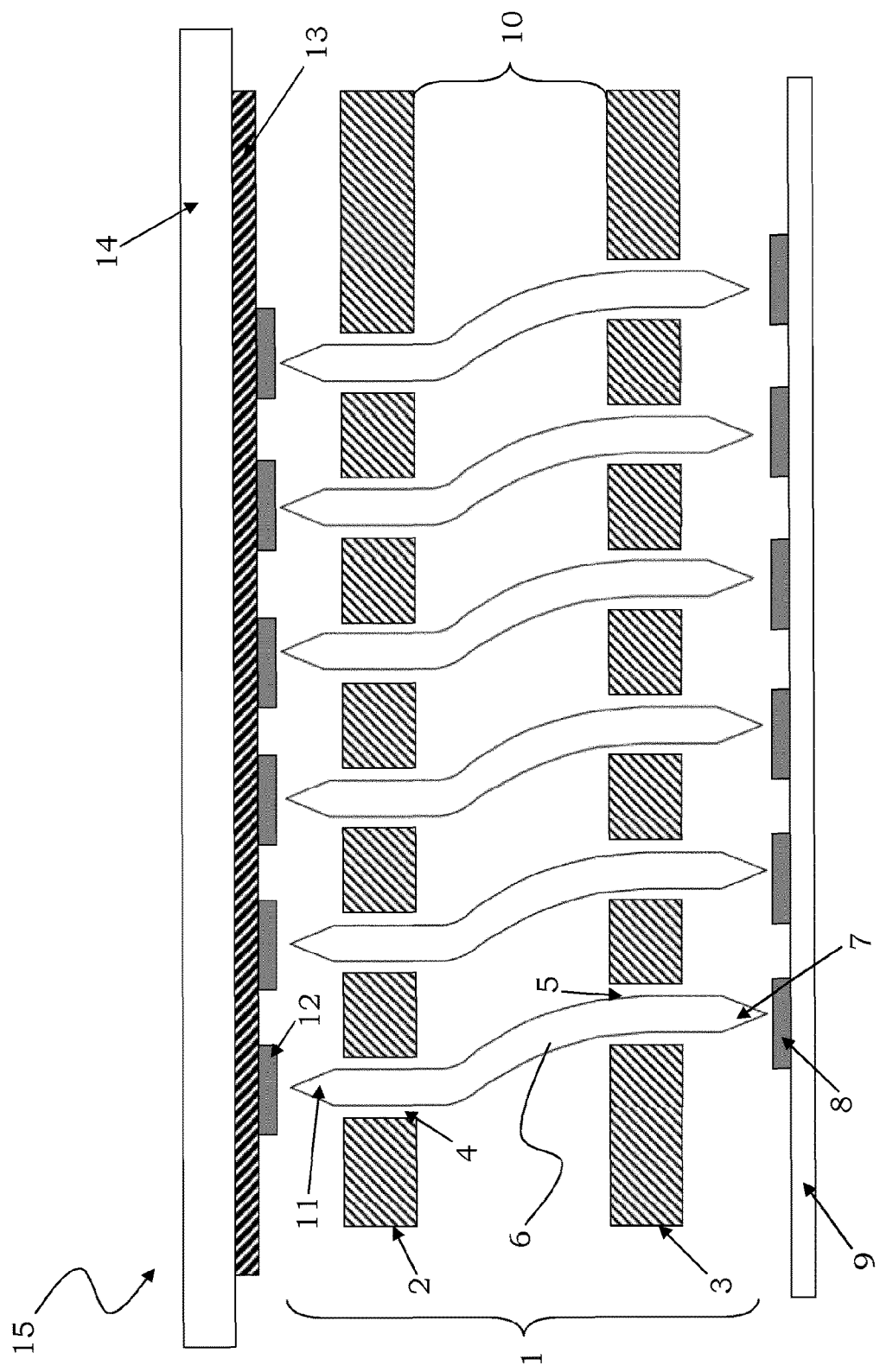
FIG. 1 schematically shows a probe card made according to the prior art.
Figure 2A:
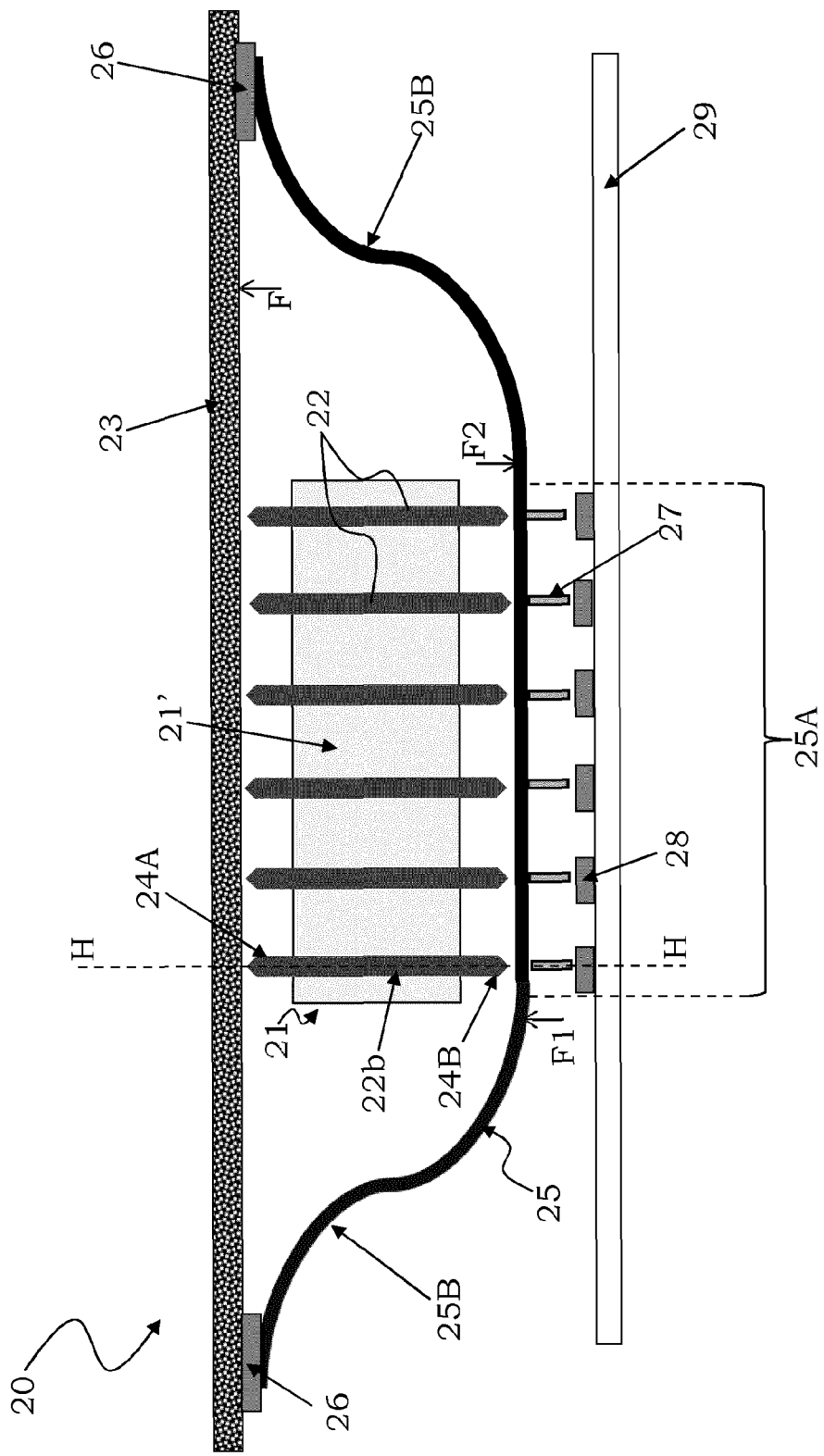
FIGS. 2A and 2B schematically show a probe card made according to the disclosure.
Figure 2B:
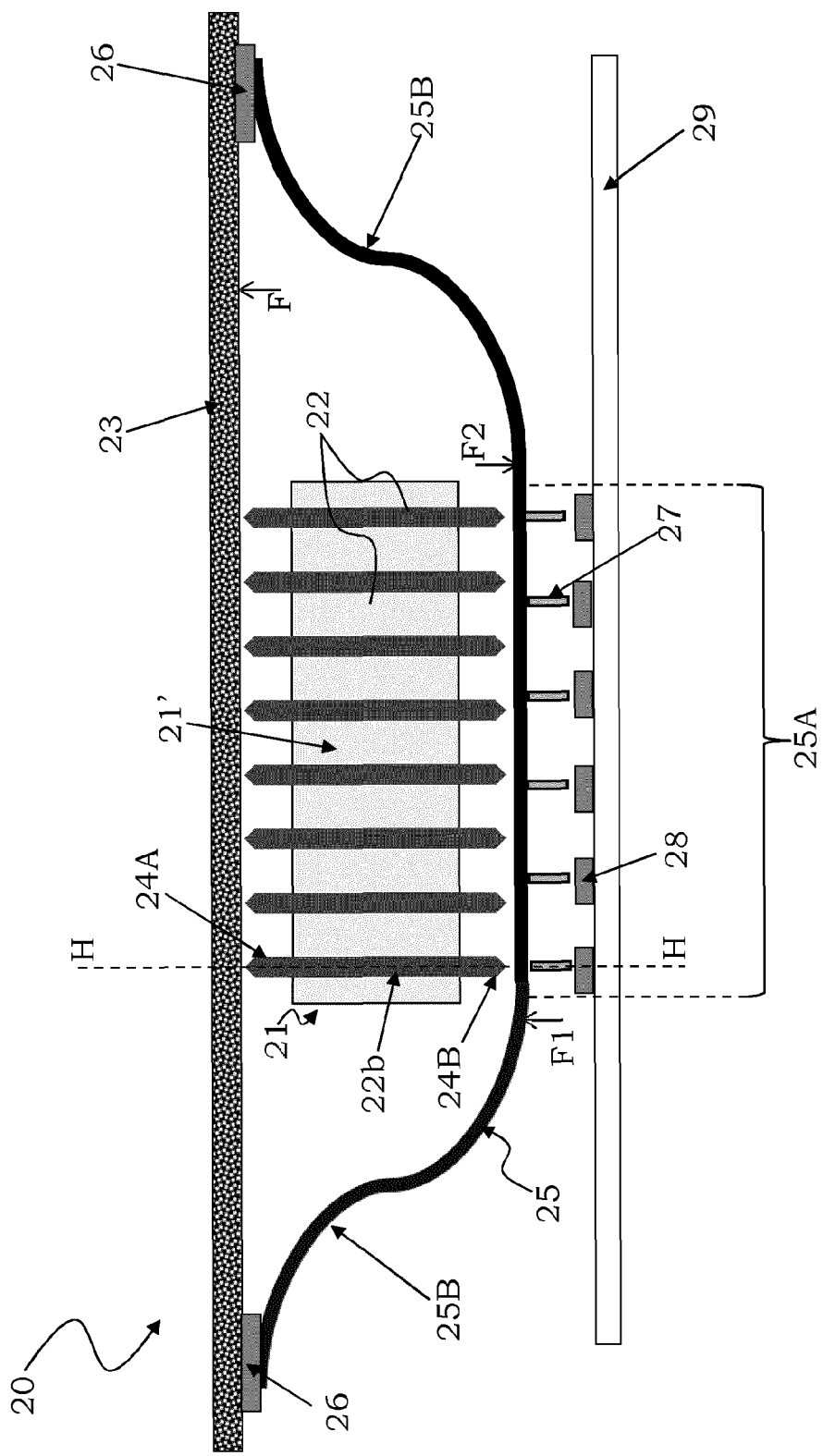

With reference to said figures, and in particular to FIGS. 2A and 2B, reference number 20 globally and schematically indicates a probe card made according to the disclosure.

It should be noted that the figures represent schematic views and are not drawn to scale, but instead they are drawn so as to enhance the important features of the disclosure.

Furthermore, in the figures, the different elements are schematically shown and their shape can vary according to the desired application. It should also be noted that in the figures identical reference numbers refer to elements identical in shape or function. Finally, particular features described in relation to an embodiment illustrated in a figure can also be used for the other embodiments illustrated in the other figures.

In its more general form, the probe card 20 is adapted to connect to an apparatus (not shown in the figures) for testing electronic devices that are integrated on a semiconductor wafer.

The probe card 20 comprises a testing head 21, which houses a plurality of contact elements 22, six of said contact elements 22 being shown in FIG. 2A and eight of said contact elements 22 being shown in FIG. 2B just by way of example.

In general, the testing head 21 comprises a main body 21' intended to house the contact elements 22, said main body 21' thus realizing the support structure of said contact elements 22.

The probe card 20 further comprises a support plate 23, which is preferably a printed circuit board (PCB) that ensures the connection between said probe card 20 and the testing apparatus.

The contact elements 22 comprise a body 22b, which extends along a longitudinal axis H-H between a first end portion 24A and a second end portion 24B, the first end portion 24A being adapted to abut onto the support plate 23.

The probe card 20 also comprises a flexible membrane 25, the testing head 21 being suitably interposed between the flexible membrane 25 and the support plate 23.

Specifically, the flexible membrane 25 comprises a first portion or central portion 25A and a second portion or peripheral portion 25B, which are intended to contact the testing head 21 and the support plate 23, respectively.

In particular, the flexible membrane 25 is electrically connected to the support plate 23 by means of its peripheral portion 25B, said electric connection occurring for instance by means of suitable conductive contact pads 26 of the support plate 23 and suitable contact pads or conductive portions (not shown) made on the flexible membrane 25 in its peripheral portion 25B.

As shown in FIGS. 2A and 2B, the contact pads 26 of the support plate 23 are made on a face thereof F facing towards the testing head 21, said face F being a lower face according to the local reference of FIG. 2.

In an embodiment not shown in the figures, the support plate 23 can comprise suitable openings to allow the passage of the flexible membrane 25 through it, said flexible membrane 25 being connected in this case to contact pads (not shown) made on a face opposite the face F of the support plate 23, namely on an upper face thereof according to the local reference of FIG. 2.

In a preferred embodiment of the disclosure, conductive portions of the flexible membrane 25 are connected to the contact pads 26 of the support plate 23 by means of a pressing contact. Alternatively, the flexible membrane 25 and the support plate 23 can be associated by means of a conductive rubber or by means of welding.

In case the support plate 23 has openings for the passage of the flexible membrane 25, it is also possible for said flexible membrane 25 to be directly connected with the testing apparatus by means of radiofrequency connection means, such as for instance coaxial cables or SMA connectors, coming from the testing apparatus. In other terms, conductive tracks in the membrane can be directly connected to the testing apparatus by means of said radiofrequency connection means.

Advantageously according to the disclosure, the probe card 20 further comprises a plurality of contact tips 27 arranged on a first face F1 of the flexible membrane 25, in particular made at its central portion 25A, said first face F1 being a lower face of the flexible membrane 25 according to the local reference of FIG. 2.

The contact tips 27 are adapted to abut onto contact pads 28 of a device under test that is integrated on a semiconductor wafer 29 and are made of a conductive material selected for instance from platinum, rhodium, palladium, silver, copper or an alloy thereof, preferably a platinum alloy.

The contact tips 27 are preferably T-shaped (or shaped as an inverted mushroom), wherein the stem of the T is connected to the flexible membrane 25, while the head of the T is adapted to contact the contact pads 28 of the device under test. Alternatively, the contact tips 27 can be shaped as conductive bumps, which can include in turn a protruding contact portion made of rhodium for contacting the contact pads 28 of the device under test. Clearly the above exposed examples should not be considered as limiting the disclosure, since the contact tips 27 can be of any shape suitable for connecting the contact pads 28 of the device under test.

Suitably, the contact tips 27 have a height much lower than the height of the contact probes used in the known solutions, in particular they have a height lower than at least 200 µm, in general comprised between 10 µm and 200 µm.

It should be pointed out that, in the present description, the term height means a dimension of the contact tips 27 measured in a direction parallel to the longitudinal axis H-H of the contact elements 22, namely the direction corresponding to the length of said contact elements 22.

It is thus clear that the contact tips 27 of the probe card 20 of the disclosure are suitable for testing high-frequency devices, their height being such as to avoid disadvantageous self-inductance phenomena.

Furthermore, the contact elements 22 of the testing head 21 abut onto a second face F2 of the flexible membrane 25, opposite the first face F1. In particular, each contact element 22 abuts onto the second face F2 of the flexible membrane 25 by means of its second end portion 24B, said second face F2 being an upper face according to the local reference of FIG. 2, namely a face facing towards the testing head 21.

In a preferred embodiment of the disclosure illustrated in FIG. 2B, the number of contact elements 22 does not correspond to the number of contact tips 27; in particular, while the distribution of the contact tips 27 should mirror the distribution of the contact pads 28 of the device under test, the distribution of the contact elements 22 could be arranged in other ways, in particular following different criteria or in order to meet different requirement for the probe card 20 as a whole.

For instance, the contact elements 22 are equally spaced within the central portion 25A of the flexible membrane 25 or they are higher in number in a strong section of the flexible membrane 25 that in a more delicate section of the same. The number e distribution of the contact elements 22 could be also arranged according to the force distribution against the flexible membrane 25, in particular due to the force applied by the contact tips 27.

It should be also pointed out that the contact elements 22 are electrically insulated from the contact tips 27, in particular thanks to the flexible membrane 25 interposed therebetween.

In this way, the contact elements 22 acts as a damping element for the contact tips 27 as a whole, adjusting the contact force thereof onto the contact pads 28 of the device under test that is integrated on the semi-conductor wafer 29.

Indeed, it should be pointed out that the contact elements 22 of the testing head 21 have a length comprised between 1.5 mm and 10 mm, namely a length much greater than the height of the relative contact tips 27 which, as previously seen, is lower than 200 µm, and therefore they have a much greater bending capacity. Suitably, said contact elements 22 are also made of materials suitable for maximizing the damping effect for the contact tips 27.

Furthermore, it should be pointed out that each contact element 22 moves independently of the adjacent ones, so allowing each contact tip 27 to also move independently of the adjacent ones when contacting the contact pads 28 of the device under test. This aspect, along with the flexibility of the interposed flexible membrane 25, allows effectively compensating possible differences in level of the device under test, in particular of the contact pads 28 thereof.

Figure 3A:
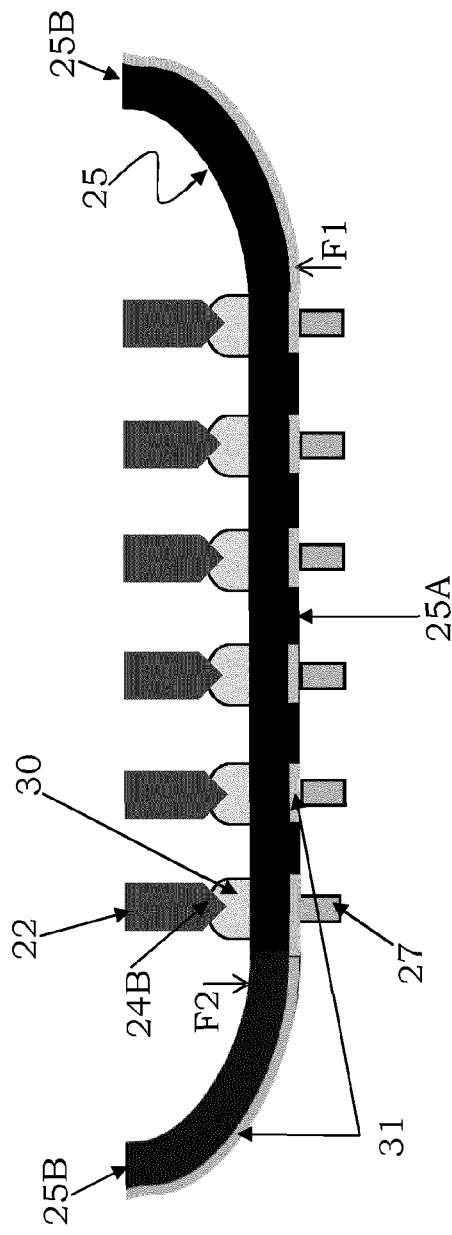
FIG. 3A shows a detail of a probe card according to the disclosure.

Now, with reference to FIG. 3A, the flexible membrane 25 comprises in turn a plurality of contact pads 30, made on its second face F2, whereonto the second end portion 24B of the contact elements 22 is adapted to abut. The contact pads 30 are in particular adapted to damp the abutment of the second end portion 24B of the contact elements 22 on the flexible membrane 25, substantially acting as a protective structure of said flexible membrane 25.

The flexible membrane 25 further comprises conductive tracks 31 adapted to carry signals from the contact tips 27 towards the support plate 23, in particular towards the contact pads 26 thereof.

The contact tips 27 are suitably connected to the conductive tracks 31 of the flexible membrane 25, in particular at end portions thereof, said conductive tracks 31 extending from the central portion 25A of the flexible membrane 25, at the relative contact tip 27 which they are connected to, towards the peripheral portion 25B of said flexible membrane 25, so that they can be welded to the contact pads 26 of the support plate 23.

In a preferred embodiment, the contact tips 27 are welded to the conductive tracks 31. Alternatively, it is possible to glue the contact tips 27 to the conductive tracks 31 by means of a conductive glue film.

In this way, the conductive tracks 31, which are also flexible, perform the desired redirection of the signals from the contact tips 27 towards the pads 26 of the support plate 23.

As a result, the flexible membrane 25, besides providing a support surface for the contact elements 22 of the testing head 21, performs the redirection of the signals towards the PCB board by means of the conductive tracks 31 and therefore it also performs the function generally performed by the space transformers of the known probe cards.

It is obviously possible for the probe card 20 to further comprise an additional card having the function of space transformer, so that the redirection of the signals can be performed both by the conductive tracks 31 of the flexible membrane 25 and by said space transformer.

In the embodiment shown in FIG. 3A, the conductive tracks 31 extend along the first face F1 of the flexible membrane 25 starting from the relative contact tip 27.

The conductive tracks 31 can also extend on the second face F2 of the flexible membrane 25, if required by the configuration.

Figure 3B:
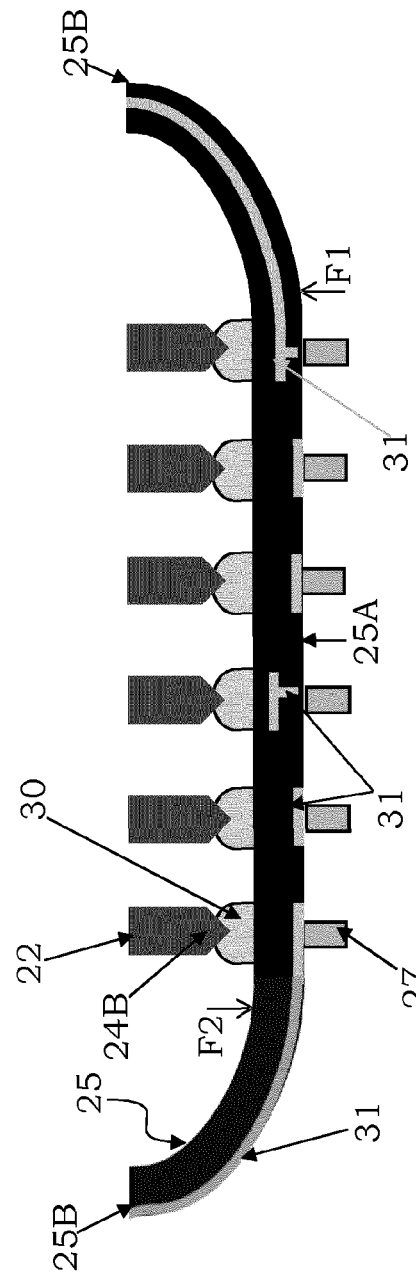
FIG. 3B shows a detail of a probe card according to an alternative embodiment of the disclosure.

Furthermore, in an embodiment of the disclosure shown in FIG. 3B, the conductive tracks 31 also extend inside the flexible membrane 25 (namely they can be embedded therein) and thus they may not only extend on the first face F1 thereof.

In this case, it is possible to make a flexible membrane 25 wherein the conductive tracks 31 are made on different levels starting from the first face F1. The number of levels of the flexible membrane 25 wherein the conductive tracks 31 are made may vary according to the needs and/or circumstances, in particular according to the number of signals to be carried and thus according to the complexity of the redirection pattern to be made on said flexible membrane 25. For instance, a configuration can be provided, wherein a first level comprises tracks suitable for carrying the power signal and a second level comprises tracks suitable for carrying the ground signal.

In case of conductive tracks 31 embedded in the flexible membrane 25, the end portions of said conductive tracks 31 in any case protrude from the first face F1 of the flexible membrane 25, so as to allow the electrical connection between said conductive tracks 31 and the relative contact pits 27, which are connected to said conductive tracks 31, as illustrated in FIG. 3B, in particular to said end portions.

The flexible membrane 25 is made of dielectric materials, preferably polyamide, capable of providing the desired flexibility and the desired electric insulation, whereas the conductive tracks 31 of the flexible membrane 25 are preferably made of copper.

In general, the flexible membrane 25 comprising the conductive tracks 31 can be made by means of lithographic processes of the known type. This technique is advantageous in case of conductive tracks 31 embedded in the flexible membrane 25, allowing making said flexible membrane 25 in the shape of a multilayer, wherein a layer comprising said conductive tracks 31 is made between at least two dielectric layers 31.

Furthermore, it should be pointed out that the support plate 23 has a configuration analogous to that of the PCB boards of the prior art, with the difference that the contact pads 26 thereof are preferably made on a peripheral portion thereof, so that the same can electrically contact the conductive tracks 31 (or possible pads of the membrane) at the peripheral portion 25B of the flexible membrane 25.

Figure 4:
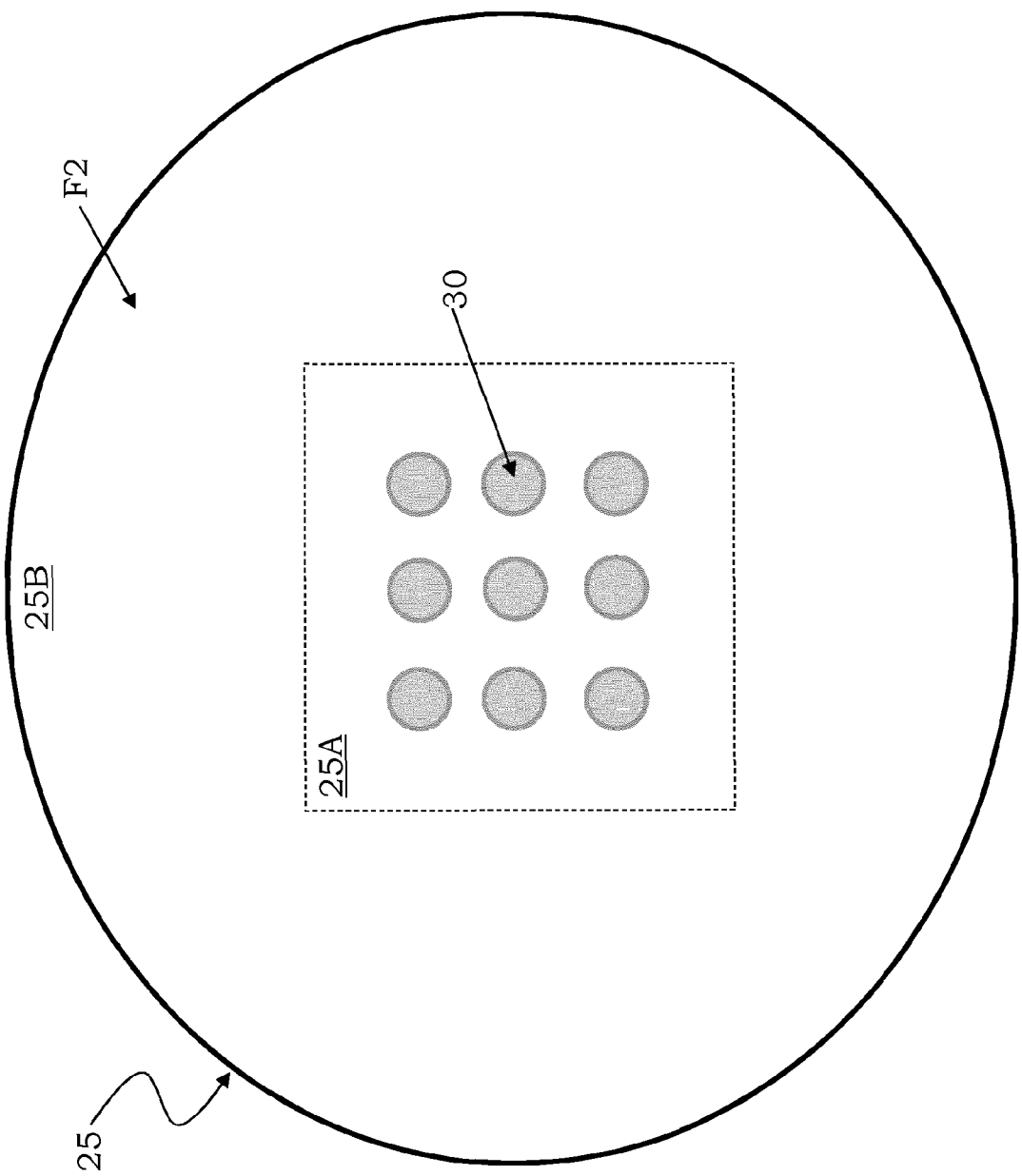
FIG. 4 shows a schematic view from above of a flexible membrane of the probe card of FIG. 3A or 3B, in particular of a face thereof facing towards a testing head.

FIG. 4 shows a schematic view from above of the flexible membrane 25 of the probe card of FIGS. 3A and 3B, in particular of its second face F2 facing towards the testing head 21.

More particularly, the contact pads 30 of the flexible membrane 25, whereonto the contact elements 22 abut, are made on its central portion 25A, which therefore defines a contact area of said flexible membrane 25, said contact area corresponding to an area of the device under test that is integrated on the wafer 29 comprising the contact pads 28. In other terms, the contact elements 22 and the respective contact pads 30 of the flexible membrane 25 are only at the contact area of said flexible membrane 25, the peripheral portion 25B of the flexible membrane 25 being a portion external to said contact area.

Figure 5:
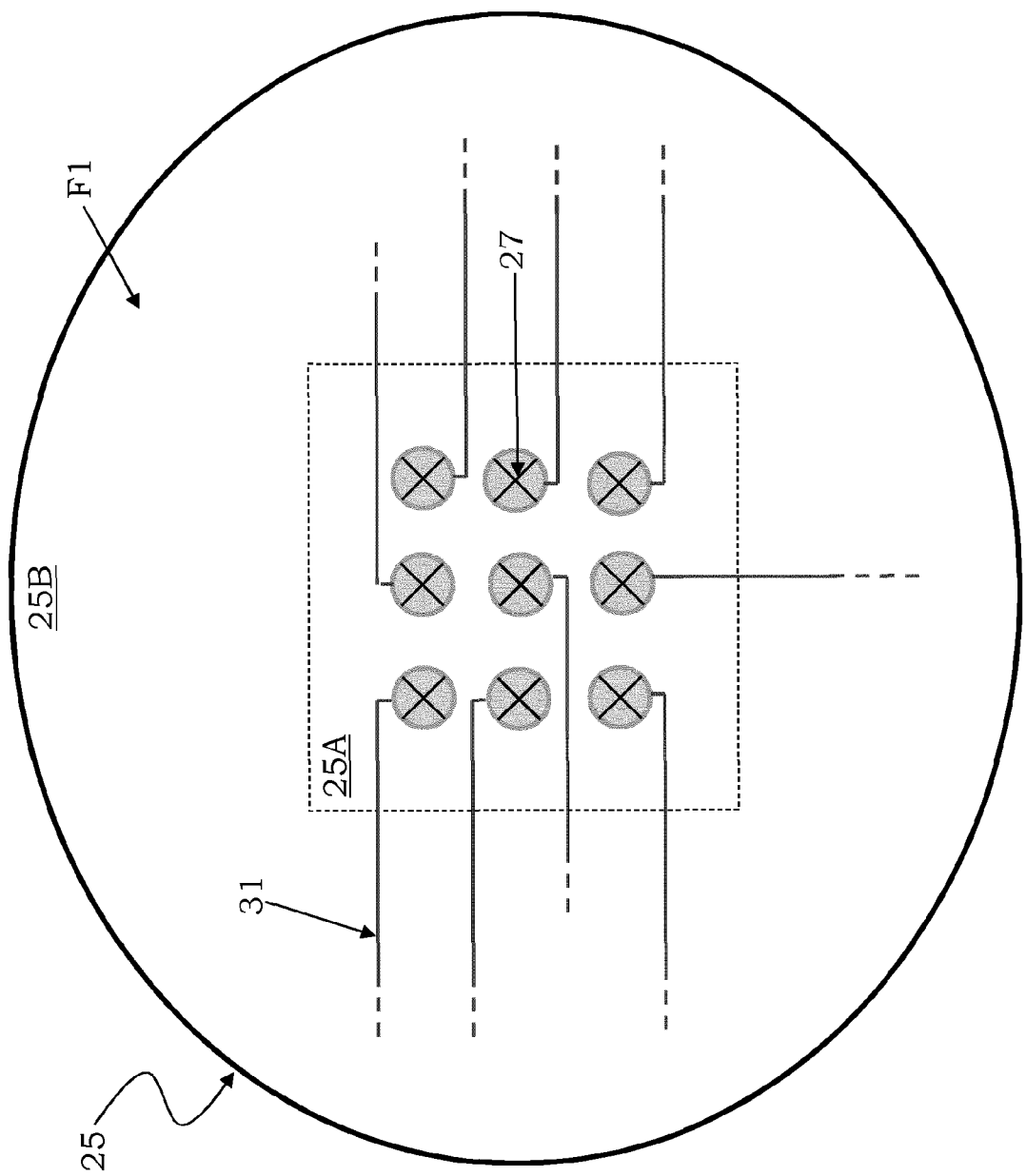
FIG. 5 shows a schematic view from above of the flexible membrane of the probe card of FIG. 3A, in particular of a face thereof opposite the face represented in FIG. 4.

Instead, FIG. 5 shows a schematic view from above of the flexible membrane 25 of the probe card of FIG. 3A, in particular of its first face F1, whereon the contact tips 27 are connected.

As clear from said figure, the conductive tracks 31 extend on the first face F1 starting from the contact tips 27 towards the peripheral portion 25B of the flexible membrane 25, so as to allow the connection with the PCB board.

Even if not shown by the FIGS. 4 and 5 which are only exemplary depicts, it is remarked that the number of the contact elements 22 does not correspond to the number of the contact tips 27 as well as the distance between two adjacent contact elements 22 is different from the distance between two adjacent contact tips.

For instance, in an embodiment illustrated in FIG. 6A, it is possible for a contact tip 27 to be adjacent to contact tips 27 and sharing a common contact element 22, the support realized by the contact elements being enough to support the membrane and to obtain the desired damping effect for two adjacent contact tips. It is obvious that the same situation could interest more than two contact tips and a single contact elements.

Furthermore, in a further embodiment illustrated in FIG. 6B, a contact element 22 abuts onto an area of the second face F2 of the flexible membrane 25 at more than one contact tip 27, the contact pads 30, whereonto the contact elements 22 abut, extending so as to cover an area of the flexible membrane 25 corresponding to more than one contact tip 27 (three contact tips in FIG. 6B), so that more than one contact tip 27 correspond to each contact element 22, abutting onto said contact pad 30. In other terms, to each contact pad 30 of the flexible membrane 25 a relative contact element 22, abutting thereonto, corresponds, but to said contact element 22 more than one contact tip 27 correspond, namely those contact tips 27 below the relative contact pad 30.

The embodiments of FIGS. 6A and 6B are particularly advantageous in case of electronic devices under test having very reduced pitches.

A dual situation can be envisaged with a probe card 20 including a plurality of contact elements 22 being higher in number with respect to the contact tips 27, as shown for instance in FIG. 2B.

In the embodiments illustrated in FIGS. 2A-2B, 3A-3B, 4, 5 and 6A-6B, the contact elements 22 are not adapted to carry signals, but are only included as damping elements of the probe card 20, so as to overcome the problem due to the rigidity of the contact tips 27 and to avoid breaking them when they contact the pads 28 of the device under test. Alternatively, in an embodiment of the disclosure illustrated in FIG. 7, also a group 22' of the contact elements 22 is adapted to carry signals between the testing device and the testing apparatus. Each contact element of said group 22' is thus electrically connected to a corresponding contact tip 27 by means of connection conductive tracks 31' in the flexible membrane 25, said connection conductive tracks 31' extending between the first face F1 and the second face F2 of the flexible membrane 25. In other terms, the connection conductive tracks 31' are adapted to connect opposite faces F1 and F2 of the flexible membrane 25, said tracks being made for instance by filling suitable through-holes or paths made in said flexible membrane 25 with conductive material.

The contact elements of the group 22' thus perform a dual function, namely on the one hand they act as damping elements for the probe card 20, in particular for the contact tips 27 thereof, on the other hand they carry signals towards the support plate 23. In this embodiment, the contact elements not comprised in the group 22' are electrically insulated from the contact tips 27 and also from the other contact elements, only maintaining the function of damping elements.

In this embodiment, the support plate 23 comprises further conductive contact pads (not shown in the figures) at the first end portion of the contact elements of the group 22', whereonto said end portions abut for actually carrying the signals towards the testing apparatus.

Furthermore, in this embodiment, at least one group 30' of the contact pads 30 of the flexible membrane 25 is made of a conductive material and the second end portions 24B of the contact elements of the group 22' abut onto contact pads of said group 30', which are connected to the connection conductive tracks 31'.

It is also possible to make the contact pads of the group 30' so that they pass through the flexible membrane 25 and emerge on the two faces F1 and F2 thereof, then protruding from the second face F2.

Figure 7:
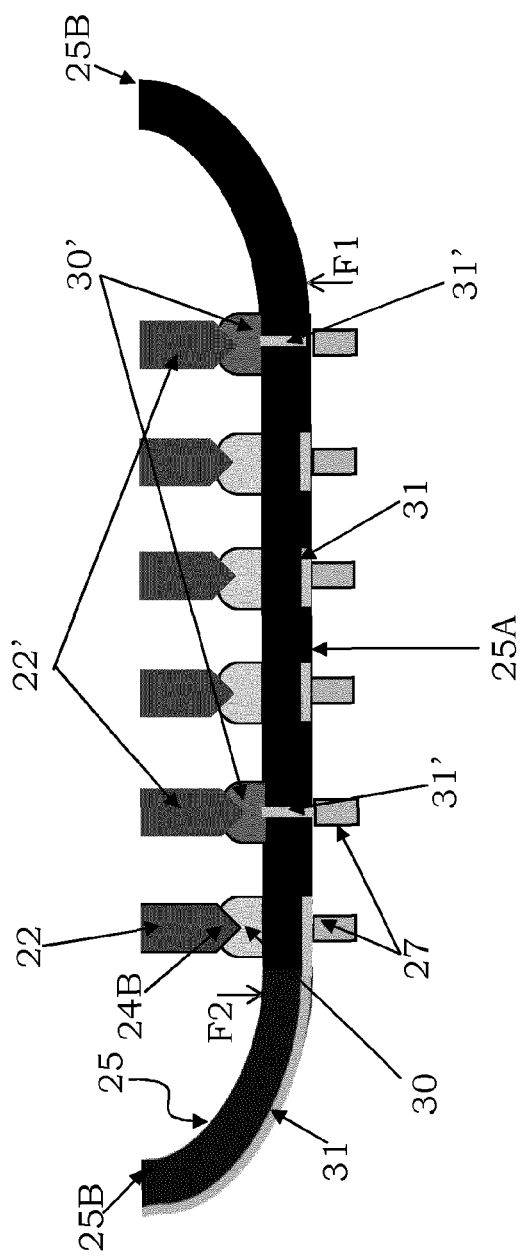
FIG. 7 shows a detail of a probe card according to a further alternative embodiment of the disclosure.

The embodiment of FIG. 7 is particularly advantageous in the case of probe cards intended to carry several signals, since in this way the signals that do not need to be carried by short probes, namely low-frequency signals, can be carried by the contact elements of the group 22', whereas high-frequency signals can be carried by the contact tips 27 connected to the conductive tracks 31 of the flexible membrane 25, greatly simplifying the routing of the signals by said flexible membrane 25. As a result, the contact elements of the group 22' are preferably adapted to carry power and/or mass signals, as well as they can be adapted to carry low frequency input/output signals namely, signals that can also be carried by not short probes without incurring self-inductance problems.

Figure 8:
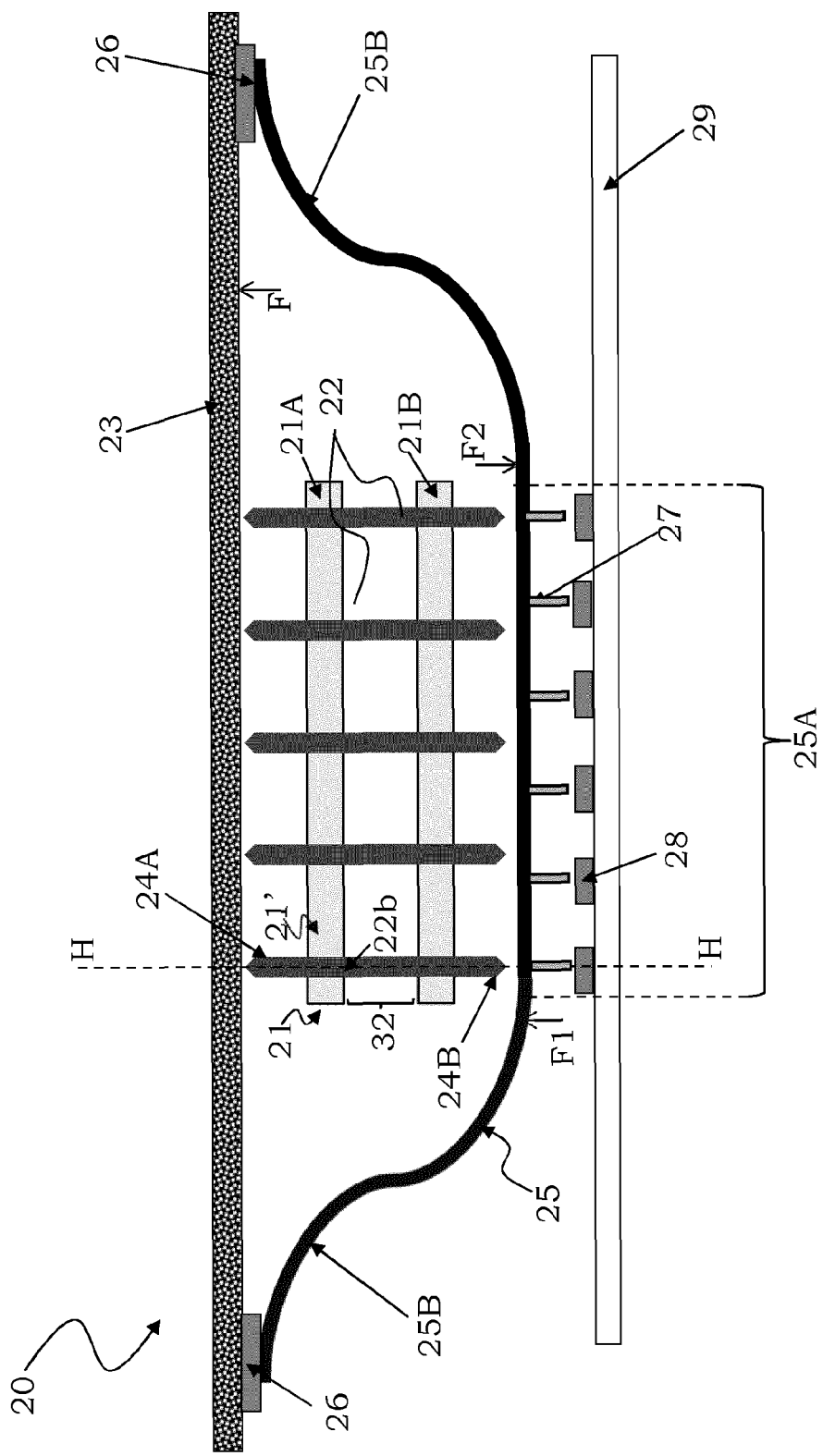
FIG. 8 schematically shows a probe card made according to a yet further alternative embodiment of the disclosure.

In an embodiment of the disclosure, illustrated in FIG. 8, the main body 21' of the testing head 21 comprises an upper plate or guide 21A and a lower plate or guide 21B, having respective guide holes within which the contact elements 22 are slidingly housed, the upper guide 21A and the lower guide 21B being separated from each other by an air gap 32. When the main body 21' of the testing head 21 is in the form of a pair of parallel guides, the air gap 32 allows deforming the contact elements 22 when they contact the support plate 23 and the flexible membrane 25.

In conclusion, the disclosure provides a probe card whose contact probes are shaped as very short contact tips connected to a face of a flexible membrane, a contact element of a testing head included in the probe card being arranged at a contact tip, on the opposite face of the flexible membrane, said contact elements abutting onto said opposite face of said flexible membrane so as to damp the contact of the contact tips with corresponding pads of a device under test.

Advantageously according to the disclosure, the proposed probe card is particularly performing in radiofrequency applications, thanks to the reduced dimensions of the contact tips therein comprised, having a height less than 200 µm.

The presence of the contact elements of the testing head interposed between the membrane and the PCB, which substantially operate as a whole as a damping element for the contact tips (namely they are adapted to damp the contact between the contact tips and the contact pads of a testing device), allows preventing the rigidity of said tips, drastically reducing the possibility of breakage of the tips themselves, meanwhile ensuring a proper reduction in the pressure they exert, avoiding any breakages of the contact pads of the devices under test whereonto the tips abut.

Indeed, it should be noted that the contact elements of the testing head have a length greater than the height of the relative contact tips and therefore they have a much greater bending capacity.

Advantageously, the distribution of the contact elements could be arranged in other ways, in particular following different criteria or in order to meet different requirement for the probe card as a whole with respect to the distribution of the contact tips which is instead tied to the distribution of the contact pads of the device under test. In particular, the contact elements as a whole act as a damping element for the contact tips, as a needles mat, the contact elements being however movable independently one to another.

What makes the present solution particularly attractive compared to known solutions is the presence of a plurality of discrete contact elements abutting onto the flexible membrane, these elements providing a support for the contact tips independently of the other contact elements, therefore capable of compensating for any lack of uniformity in the probe card, in terms of levels, heights and force exerted onto the pads.

In this way, at least locally, there is a complete independence of the movement of a contact tip with respect to the adjacent ones, precisely thanks to the independence of movement of the contact elements that act as damping elements for these tips.

As a result, the probe card of the disclosure on the one hand allows testing high-frequency electronic devices, and on the other hand allows avoiding the breakage of its contact tips and/or of the contact pads of a device under test, thus solving the technical problem of the disclosure.

Therefore, the probe card of the disclosure works correctly even in case of problems of planarity of the elements which it is constituted of or of the wafer and of the devices under test comprised therein.

In other terms, on the one hand the contact elements of the testing head support the contact tips in the central area of the flexible membrane, thus avoiding said membrane from bending, and on the other hand solve the problem of rigidity of said probes by acting as a damping element, bending as a spring when the tips contact the pads of a device under test.

Furthermore, the possibility to adopt a hybrid configuration, in which also some contact elements are adapted to carry specific signals, greatly simplifies the signal routing by the flexible membrane, especially in the case of several signals to be carried by means of the probe card. For instance, by means of said contact elements it is possible to carry power signals and/or ground signals, namely signals that do not require particularly short contact probes, whereas the high-frequency signals, which require short probes to avoid self-inductance problems, are only carried by the contact tips associated with the flexible membrane.

It should be noted that the several advantages of the probe card of the disclosure are achieved by exploiting the technology of the vertical probe testing heads, without thereby excessively complicating its implementation process.

Finally, it should be noted that the structure of the probe card according to the disclosure ensures a low contact resistance.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

That which is claimed is:

1. A probe card comprising:
   a plurality of contact elements extending along a longitudinal axis between a first end portion and a second end portion;
   a plurality of contact tips;
   a testing head housing the plurality of contact elements;
   a support plate;
   a flexible membrane having a first face and a second face, opposite to the first face;
   the first end portions of the plurality of contact elements abutting onto the support plate;
   the plurality of contact tips being arranged on the first face of the flexible membrane at a first portion thereof;

the second end portions of the plurality of contact elements abutting onto the second face the flexible membrane;

wherein the testing head is arranged between the support plate and the first portion of the flexible membrane, which is electrically connected to the support plate through a second portion thereof;

wherein the number and distribution of the contact elements abutting onto the second face of the flexible membrane at the first portion are different to the number and distribution of the contact tips abutting onto the first face of the flexible membrane at the first portion; and wherein the testing head comprises at least one upper guide and at least one lower guide, each having guide holes within which respective contact elements are slidingly housed, the at least one upper guide and at least one lower guide having a gap therebetween.

2. The probe card of claim 1, wherein the contact tips have a height less than 200 μm, the height being measured along the longitudinal axis.

3. The probe card of claim 1, wherein the flexible membrane includes conductive tracks extending from the first portion of the flexible membrane at each contact tip towards the second portion of the flexible membrane.

4. The probe card of claim 3, wherein the contact tips are electrically connected to the conductive tracks by a connection comprising at least one of a welding portion and a conductive glue film.

5. The probe card of claim 3, wherein the conductive tracks are electrically connected to contact pads of the support plate.

6. The probe card of claim 5, wherein the flexible membrane and the support plate are electrically connected to each other by at least one of a pressing contact, a conductive rubber, and welding.

7. The probe card of claim 3, wherein the conductive tracks are directly connected to the testing apparatus by a radio frequency connection.

8. The probe card of claim 1, wherein the contact elements of the testing head comprise a first group of contact elements;
    each contact element of the first group being electrically connected to a corresponding contact tip;
    the contact elements not included in the first group being electrically insulated from the contact tips and from the contact elements of the first group.

9. The probe card of claim 8, wherein each contact element of the first group is electrically connected to a corresponding contact tip by connection conductive tracks in the flexible membrane, the connection conductive tracks extending between the first face of the flexible membrane and the second face of the flexible membrane.

10. The probe card of claim 8, wherein the contact elements of the first group are adapted to carry signals comprising at least one of power signals, ground signals and low frequency signals.

11. The probe card of claim 1, wherein the second face of the flexible membrane comprises a plurality of contact pads whereonto the second end portion of the contact elements are adapted to abut.

12. The probe card of claim 9, wherein at least one first group of the contact pads of the flexible membrane is made of a conductive material, the second end portions of the contact elements of the first group abutting onto the contact pads of the first group.

13. The probe card of claim 1, wherein the number of the contact elements is smaller than the number of the contact tips.

14. The probe card of claim 12, wherein the contact pads, onto which the contact elements abut, extend so as to cover an area of the flexible membrane corresponding to at least more than one contact tip, at least more than one contact tip corresponding to each of the contact elements abutting onto the contact pads.

15. The probe card of claim 1, wherein the first portion of the flexible membrane is a central portion and the second portion of the flexible membrane is a peripheral portion.

16. A probe card comprising:
    a plurality of contact elements extending along a longitudinal axis between a first end portion and a second end portion;
    a plurality of contact tips, having a height less than 200 μm, the height being measured along the longitudinal axis;
    a testing head housing the plurality of contact elements;
    a support plate;
    a flexible membrane having a first face and a second face opposite to the first face, and including conductive tracks extending from the first portion of the flexible membrane at each contact tip towards the second portion of the flexible membrane;
        the first end portions of the plurality of contact elements abutting onto the support plate;
        the plurality of contact tips being arranged on the first face of the flexible membrane at a first portion thereof;
        the second end portions of the plurality of contact elements abutting onto the second face the flexible membrane;
        wherein the testing head is arranged between the support plate and the first portion of the flexible membrane, which is electrically connected to the support plate through a second portion thereof;
    wherein the number and distribution of the contact elements abutting onto the second face of the flexible membrane at the first portion are different to the number and distribution of the contact tips abutting onto the first face of the flexible membrane at the first portion; and
    wherein the testing head comprises at least one upper guide and at least one lower guide, each having guide holes within which respective contact elements are slidingly housed, the at least one upper guide and at least one lower guide having a cap therebetween.

17. The probe card of claim 16, wherein the conductive tracks are electrically connected to contact pads of the support plate.

18. The probe card of claim 16, wherein the contact elements of the testing head comprise a first group of contact elements;
    each contact element of the first group being electrically connected to a corresponding contact tip;
    the contact elements not included in the first group being electrically insulated from the contact tips and from the contact elements of the first group.

19. The probe card of claim 18, wherein each contact element of the first group is electrically connected to a corresponding contact tip by connection conductive tracks in the flexible membrane, the connection conductive tracks extending between the first face of the flexible membrane and the second face of the flexible membrane.

20. The probe card of claim 18, wherein at least one first group of the contact pads of the flexible membrane is made of a conductive material, the second end portions of the contact elements of the first group abutting onto the contact pads of the first group.

21. The probe card of claim 16, wherein the number of the contact elements is smaller than the number of the contact tips.

22. The probe card of claim 20, wherein the contact pads, onto which the contact elements abut, extend so as to cover an area of the flexible membrane corresponding to at least more than one contact tip, at least more than one contact tip corresponding to each of the contact elements abutting onto the contact pads.

23. The probe card of claim 16, wherein the first portion of the flexible membrane is a central portion and the second portion of the flexible membrane is a peripheral portion.

* * * * *